(12) United States Patent
DeBeer et al.

(10) Patent No.: US 8,513,937 B2
(45) Date of Patent: Aug. 20, 2013

(54) SWITCHING REGULATOR WITH OPTIMIZED SWITCH NODE RISE TIME

(75) Inventors: Daniel J. DeBeer, San Jose, CA (US); Charles Vinn, Milpitas, CA (US)

(73) Assignee: Micrel, Inc., San Jose, CA (US)

( * ) Notice: Subject to any disclaimer, the term of this patent is extended or adjusted under 35 U.S.C. 154(b) by 215 days.

(21) Appl. No.: 13/229,184

(22) Filed: Sep. 9, 2011

(65) Prior Publication Data

US 2013/0063186 A1   Mar. 14, 2013

(51) Int. Cl.
*G05F 1/00* (2006.01)
*H03B 1/00* (2006.01)
*H03K 3/00* (2006.01)
*H03K 17/16* (2006.01)
*H03K 17/30* (2006.01)
*H03K 17/296* (2006.01)
*H03K 17/28* (2006.01)

(52) U.S. Cl.
USPC ........... 323/289; 323/283; 327/109; 327/380; 327/381; 327/398

(58) Field of Classification Search
USPC .................. 323/282–285, 289; 327/108, 109, 327/172, 175, 176, 182, 261, 289, 379–383, 327/389, 390, 392–394, 398, 399, 586, 589
See application file for complete search history.

(56) References Cited

U.S. PATENT DOCUMENTS

| | | | | |
|---|---|---|---|---|
| 5,736,888 A | * | 4/1998 | Sharpe-Geisler | 327/382 |
| 8,207,720 B2 | * | 6/2012 | Tang et al. | 323/271 |
| 2004/0130307 A1 | * | 7/2004 | Dequina et al. | 323/282 |
| 2007/0108952 A1 | * | 5/2007 | Bartolo et al. | 323/282 |
| 2007/0182390 A1 | * | 8/2007 | Ishii et al. | 323/282 |
| 2010/0072967 A1 | * | 3/2010 | Kamishinbara et al. | 323/284 |
| 2010/0213910 A1 | * | 8/2010 | Chen | 323/282 |

* cited by examiner

*Primary Examiner* — Adolf Berhane
*Assistant Examiner* — Gary Nash
(74) *Attorney, Agent, or Firm* — Van Pelt, Yi & James LLP

(57) ABSTRACT

A driver circuit for controlling a high-side power switch of a switching regulator includes: a logic circuit configured to generate a gate control signal for turning on the power switch; a diode having coupled to a first power supply voltage; a capacitor having a first electrode coupled to the cathode of the diode and a second electrode coupled to the switching output voltage; and a delay circuit configured to receive the gate control signal and to generate a delayed gate control signal. In operation, the capacitor is precharged to about the first power supply voltage. When the power switch is turned on, a first output drive transistor is turned on to distribute the charge stored on the capacitor to the gate terminal of the high-side power switch, and after the predetermined delay, a second output drive transistor is turned on to drive the output node to a high supply voltage.

13 Claims, 5 Drawing Sheets

SWITCHING REGULATOR WITH OPTIMIZED SWITCH NODE RISE TIME

FIELD OF THE INVENTION

The invention relates to switching regulators and, in particular, to a switching regulator where the switch node rise time is optimized to reduce ringing.

DESCRIPTION OF THE RELATED ART

Switch mode power supplies or switching regulators, also referred to as DC to DC converters, are often used to convert an input supply voltage to a desired output voltage at a voltage level appropriate for the internal circuitry of an integrated circuit. For example, a 5 volts supply voltage provided to an integrated circuit may need to be reduced to 2.8 volts on the IC chip to operate the internal circuitry on the chip. A switching regulator provides power supply function through low loss components such as capacitors, inductors, and transformers, and power switches that are turned on and off to transfer energy from the input to the output in discrete packets. A feedback control circuit is used to regulate the energy transfer to maintain a constant output voltage within the desired load limits of the circuit.

The operation of the conventional switching regulator is well known and is generalized as follows. A conventional switching regulator includes a pair of power switches which are turned on and off to regulate an output voltage to be equal to a reference voltage. More specifically, the power switches are alternately turned on and off to generate a switching output voltage at a switching output node, also referred to as the switch node. The switch node is coupled to an LC filter circuit including an output inductor and an output capacitor to generate an output voltage having substantially constant magnitude. The output voltage can then be used to drive a load.

More specifically, the pair of power switches is often referred to as including a "high-side power switch" and a "low-side power switch." The high-side power switch is turned on to apply energy to the output inductor of the output filter circuit to allow the current through the inductor to build up. When the high-side power switch is turned off, the voltage across the inductor reverses and the current through the inductor reduces during this cycle. This insures that the inductor current ripples above and below the nominal output current. A relatively constant output voltage is maintained by the output capacitor. The low-side power switch is turned on and off for synchronous control operation.

The switching output voltage at the switch node of the conventional switching regulators has been known to ring or swing significantly above the input supply voltage. The ringing or voltage swing of the switching output voltage is caused by the unwanted inductance in the bond wires, PC board traces and bypass capacitor connected to the input supply voltage nodes and the switch nodes. The ringing of the switching output voltage is also caused by the changing current in the high side switch. FIG. 6 illustrates an exemplary signal waveform of the switching output voltage for a conventional switching regulator. Referring to FIG. 6, curve 310 illustrates the switching output voltage ($V_{SW}$(Old)) of a conventional switching regulator where the input supply voltage is 12V. Significant ringing can be observed when the switching output voltage transitions to a logical high value. The ringing of the switching output voltage is undesirable because the ringing limits the duty cycle and prevents quick sensing of the output currents. Furthermore, the ringing of the switching output voltage can cause an overvoltage condition on the low-side power switch.

Conventional solutions to the ringing issue include snubbing which prevents undesired overvoltage conditions by conducting transient current around the low-side power switch. A snubber circuit, typically formed by a serial connection of a resistor and a capacitor, is often used to damp out the high frequency ringing caused by the parasitic inductance and capacitance. The resistor of the snubber circuit lowers the Q of the resonant circuit causing the ringing while the capacitor of the snubber circuit blocks DC current to minimize the power dissipation in the resistor. However, snubbing of the switch node requires additional circuit elements which are typically provided external to the switching regulator and snubbing is typically done at the expense of rise time and efficiency.

SUMMARY OF THE INVENTION

According to one embodiment of the present invention, a driver circuit for controlling a high-side power switch of a switching regulator where the high-side power switch is configured to drive a switching output voltage to an input supply voltage when the high-side power switch is turned on includes: a logic circuit configured to receive a first signal having a first state to turn on the high-side power switch and a second state to turn off the high-side power switch where the logic circuit is configured to generate a first gate control signal; a diode having an anode coupled to a first power supply voltage and a cathode; a capacitor having a first electrode coupled to the cathode of the diode and a second electrode coupled to the switching output voltage; a first output drive transistor having a gate terminal coupled to receive the first gate control signal, a source terminal coupled to the first electrode of the capacitor, and a drain terminal coupled to an output node of the driver circuit where the output node is coupled to drive the gate terminal of the high-side power switch; a delay circuit configured to receive the gate control signal and to generate a delayed gate control signal being the gate control signal with a predetermined delay; a second output drive transistor having a gate terminal coupled to receive the delayed gate control signal, a source terminal connected to a high supply voltage, and a drain terminal connected to the output node of the driver circuit where the high supply voltage is about the sum of the input supply voltage and the first power supply voltage. In operation, the capacitor is charged to about the first power supply voltage when the first signal has the second state. When the first signal has the first state, the first output drive transistor is turned on to distribute the charge stored on the capacitor to the output node for driving the gate terminal of the high-side power switch, and after the predetermined delay, the second output drive transistor is turned on to drive the output node to the high supply voltage.

According to another embodiment of the present invention, a method for driving a high-side power switch of a switching regulator where the high side power switch is configured to drive a switching output voltage to an input supply voltage when the high-side power switch is turned on includes: charging a capacitor to a first power supply voltage when the high-side power switch is turned off; asserting a first signal to turn on the high-side power switch; generating a gate control signal to turn on a first output drive transistor; distributing charge stored on the capacitor through the first output drive transistor to an output node where the output node is coupled to drive the gate terminal of the high-side power switch; and after a predetermined delay, turning on a second output drive transistor to drive the output node to a high supply voltage where the high supply voltage being about the sum of the input supply voltage and the first power supply voltage.

The present invention is better understood upon consideration of the detailed description below and the accompanying drawings.

DETAILED DESCRIPTION OF THE PREFERRED EMBODIMENTS

In accordance with the principles of the present invention, a driver circuit for a high-side power switch of a switching regulator incorporates a rise time control circuit to control the rise time of the switching output voltage to reduce voltage swing or ringing, ensuring that any ringing at the switching output voltage do not exceed the input supply voltage. In one embodiment, the rise time control circuit is integrated with the driver circuit of the switching regulator controller so that no circuit elements external to the switching regulator controller integrated circuit is required. The driver circuit thus configured is capable of optimizing the rise time of the switching output voltage without compromising efficiency and with minimal compromise to the rise time at the switch node.

Figure 1:
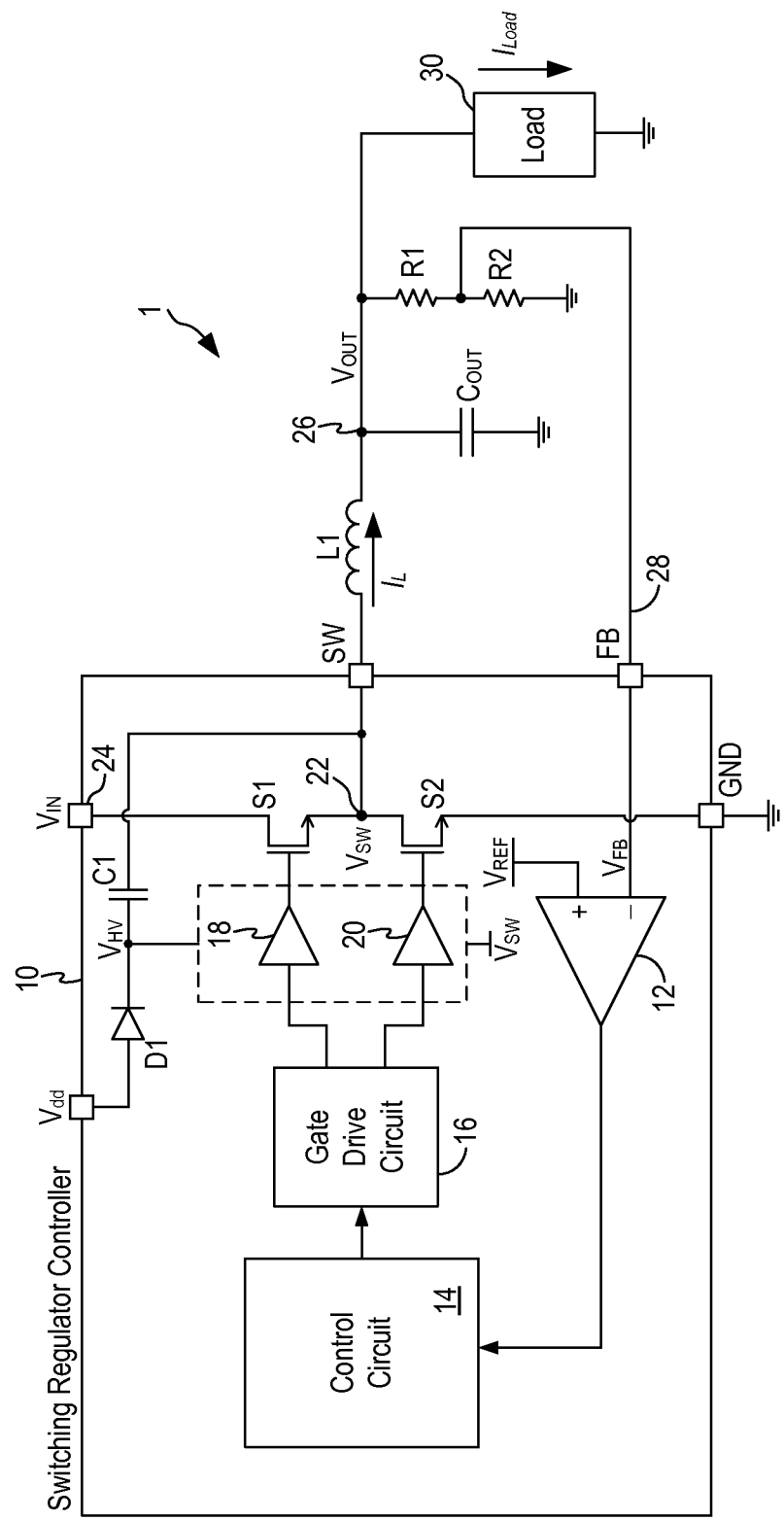
FIG. 1 is a schematic diagram of a switching regulator in which a high-side driver circuit with a rise time control circuit can be incorporated according to one embodiment of the present invention.

FIG. 1 is a schematic diagram of a switching regulator in which a high-side driver circuit with a rise time control circuit can be incorporated according to one embodiment of the present invention. Referring to FIG. 1, a switching regulator 1 includes a switching regulator controller 10 with a pair of power switches S1 and S2 integrated thereon. Power switches S1 and S2 are alternately turned on and off to generate a switching output voltage $V_{SW}$ at a switch node (SW) 22. The switching output voltage $V_{SW}$ is coupled to an LC filter circuit including an output inductor L1 and an output capacitor $C_{OUT}$ to generate a regulated output voltage $V_{OUT}$ at node 26 having a substantially constant magnitude. The output voltage $V_{OUT}$ can then be used to drive a load 30 whereby switching regulator 1 provides the load current $I_{LOAD}$ to maintain the output voltage $V_{OUT}$ at a constant level. In the present embodiment, power switches S1 and S2 are both N-type MOSFET devices. In other embodiments, power switch S1 may be implemented using a P-type MOSFET device with the appropriate reversal in control voltage polarity.

Switching regulator 1 includes a feedback control circuit to regulate the energy transfer to the LC filter circuit to maintain a constant output voltage within the desired load limits of the circuit. More specifically, the feedback control circuit causes power switches S1 and S2 to turn on and off to regulate the output voltage $V_{OUT}$ to be equal to a reference voltage $V_{REF}$ or to a voltage value related to the reference voltage $V_{REF}$. In the present embodiment, a voltage divider including resistors R1 and R2 is used to divide down the output voltage $V_{OUT}$ which is then fed back to the switching regulator controller 10 as a feedback voltage $V_{FB}$ on a feedback node 28. The feedback voltage $V_{FB}$ is compared with the reference voltage $V_{REF}$ at an error amplifier 12. The difference between the feedback voltage $V_{FB}$ and the reference voltage $V_{REF}$ is coupled to a control circuit 14 to generate control voltages for the power switches based on a switching regulator control scheme. The control voltages are then provided to a gate drive circuit 16 to generate gate drive signals for the power switches S1 and S2. The gate drive signal for the high-side power switch S1 is coupled to a high-side driver circuit 18 while the gate drive signal for the low-side power switch S2 is coupled to a low-side driver circuit 20. Driver circuits 18, 20 convert the respective gate drive signals to gate drive voltages appropriate for turning on and off the respective power switches.

In order to ensure the driver circuits 18, 20 generate gate drive voltages with voltage levels capable of turning the power switches on and off, the driver circuits 18 and 20 are powered by a high supply voltage $V_{HV}$ and the switching output voltage $V_{SW}$. That is, the driver circuits 18 and 20 are supplied by the high supply voltage $V_{HV}$ and the switching output voltage $V_{SW}$ as the power rails. The high supply voltage $V_{HV}$ is a voltage generated from a regulator power supply voltage $V_{dd}$ and is biased so that the high supply voltage $V_{HV}$ has a high voltage value at least one gate-to-source voltage of the power switch above the input supply voltage $V_{IN}$. That is, $V_{HV}=V_{IN}+V_{GS}(S1)$. In one embodiment, the input supply voltage $V_{IN}$ is 12V while the regulator power supply voltage $V_{dd}$ is 5V or 10V.

More specifically, the regulator power supply voltage $V_{dd}$ is coupled through a diode D1 to the top plate of a capacitor C1. The bottom plate of capacitor C1 is connected to the switch node 22. The high supply voltage $V_{HV}$ is generated at the top plate of capacitor C1. In operation, when the switching output voltage $V_{SW}$ is low, the regulator power supply voltage $V_{dd}$ charges capacitor C1 to the $V_{dd}$ voltage minus a diode forward voltage drop, that is, $V_{HV}=V_{dd}-V_{diode}$ (e.g., 4.5V). Then, when the switching output voltage $V_{SW}$ switches high to the input supply voltage $V_{IN}$, the top plate of the capacitor C1 is also driven up by the input supply voltage $V_{IN}$ so that a high supply voltage $V_{HV}=V_{IN}+(V_{dd}-V_{diode})$ results. Thus, the high supply voltage $V_{HV}$ has a voltage value that switches between $V_{dd}-V_{diode}$ (e.g., 4.5V) to $V_{IN}+(V_{dd}-V_{diode})$ (e.g., 16.5V). In this manner, the drive circuits 18, 20 are ensured to generate gate drive voltages with sufficient voltage values to turn on the power switches S1, S2.

Figure 2:
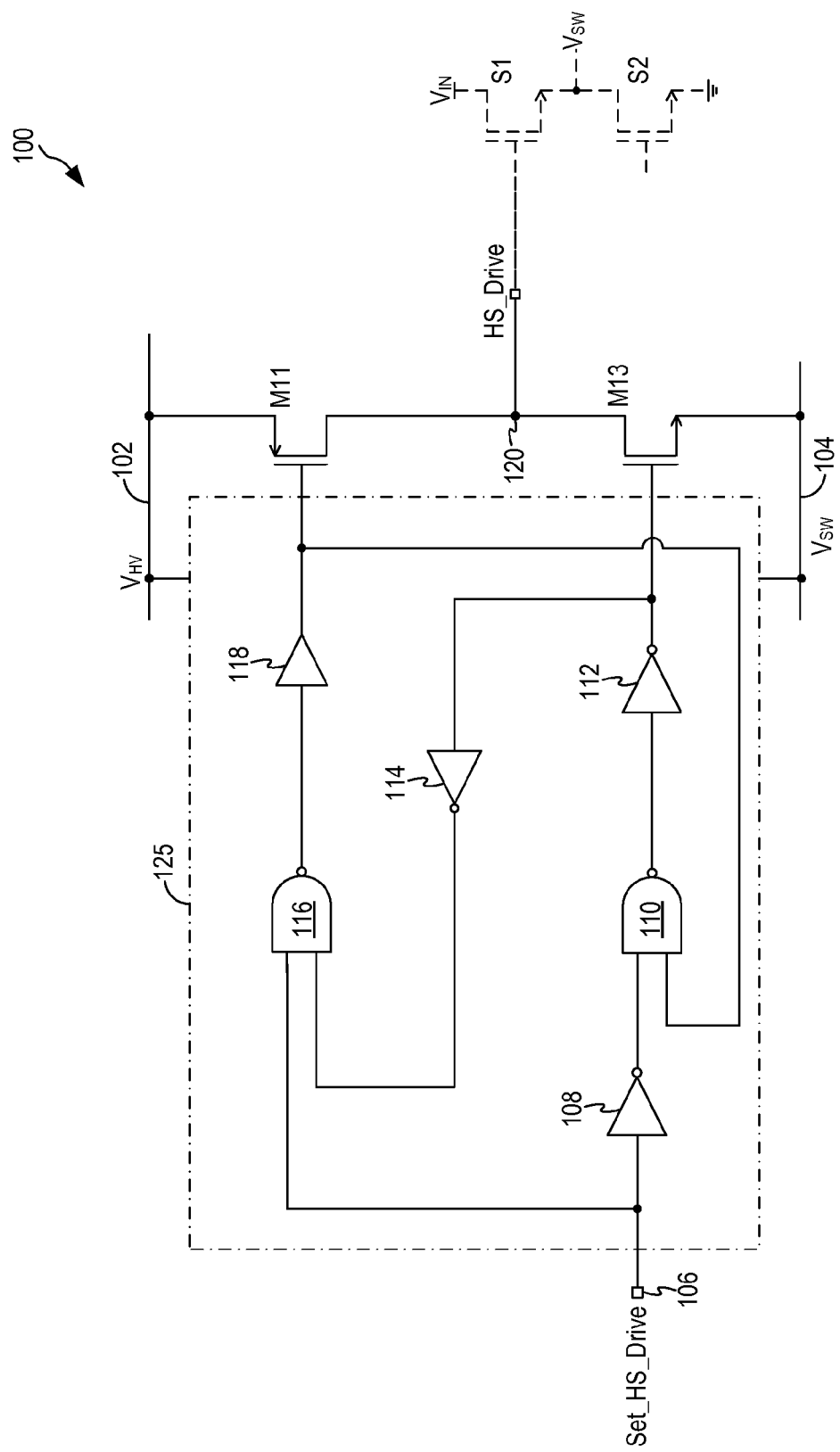
FIG. 2 is a schematic diagram of a conventional high-side driver circuit in a switching regulator.

FIG. 2 is a schematic diagram of a conventional high-side driver circuit in a switching regulator. Referring to FIG. 2, a high-side driver circuit 100 receives a "Set_HS_Drive" signal on an input node 106 as the gate drive signal for the high-side power switch. The Set_HS_Drive signal is coupled to a logic circuit 125 to generate the gate control signals to drive a pair of output drive transistors M11 and M13. The output drive transistors M11 and M13 are turned on and off alternately to generate the HS_Drive signal (node 120) which is the gate drive voltage for the high-side power switch S1. More specifically, the HS_Drive signal is driven high to turn on the power switch S1 when PMOS transistor M11 is turned on. Thus, PMOS transistor M11 controls the rise time of the switching output voltage.

The conventional high-side driver circuit 100 suffers from excessive ringing at the switching output voltage $V_{SW}$ due to parasitic inductance and parasitic capacitance associated with the switch node. The high-side driver circuit 100 provides limited ways to reduce the slew-rate or reduce the rise time of the switching output voltage $V_{SW}$. For instance, the size of the PMOS transistor M11 may be reduced to reduce the rise time of the switching output voltage. However, small size reduction of transistor M11 cannot reduce the rise time sufficiently while too much size reduction results in too slow a rise time, degrading transition efficiency. Also using size reduction to reduce the switch node rise time is very process dependence.

Figure 3:
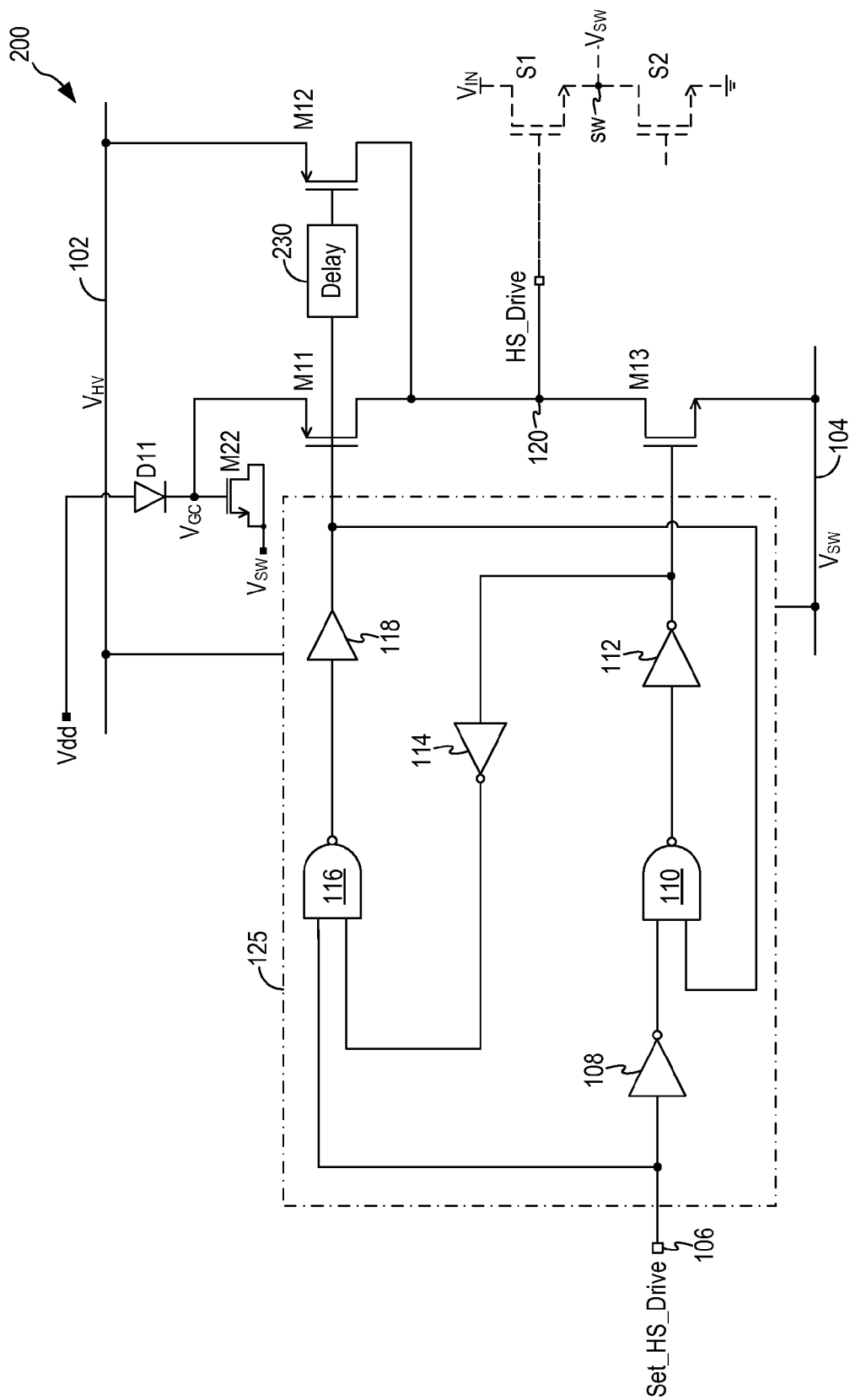
FIG. 3 is a schematic diagram of a high-side driver circuit in a switching regulator incorporating a rise time control circuit according to one embodiment of the present invention.

FIG. 3 is a schematic diagram of a high-side driver circuit in a switching regulator incorporating a rise time control circuit according to one embodiment of the present invention. Referring to FIG. 3, a high-side driver circuit 200 is implemented using the same basic driver circuit construction as the high-side driver circuit of FIG. 2 but with modifications to improve the slew rate control of the switch node rise time. High-side driver circuit 200 receives a "Set_HS_Drive" signal on an input node 106 as the gate drive signal for the high-side power switch S1. The Set_HS_Drive signal is coupled to a logic circuit 125 to generate the gate control signals to drive a set of output drive transistors M11, M12 and M13.

More specifically, in logic circuit 125, the Set_HS_Drive signal is coupled to an inverter 108 and also to the first input node of a NAND gate 116. The output of the inverter 108 drives one input node of an NAND gate 110. The output of the NAND gate 110 drives another inverter 112 which generates the gate control signal for the NMOS output drive transistor M13. NMOS transistor M13 is turned on to drive the HS_Drive signal (node 120) to a logical low which turns off the power switch S1. The output of inverter 112 is also coupled to another inverter 114 which drives the second input node of the NAND gate 116. The output of NAND gate 116 drives a buffer 118 which generates the gate control signal for the PMOS output drive transistors M11 and M12. PMOS transistors M11 and M12 are turned on to drive the HS_Drive signal (node 120) to a logical high which turns on the power switch S1.

The inverters, buffers and NAND gates in logic circuit 125 are all powered by the high supply voltage $V_{HV}$ (node 102) and the switching output voltage $V_{SW}$ (node 104) as the power rails. The switching output voltage $V_{SW}$ swings between ground and the input supply voltage $V_{IN}$ while the high supply voltage $V_{HV}$ swings between $V_{dd}-V_{diode}$ to $V_{IN}+(V_{dd}-V_{diode})$. Thus, the circuit elements in logic circuit 125 are powered by a voltage value of $V_{dd}-V_{diode}$ at all time.

In high-side driver circuit 200, PMOS transistors M11 and M12 are turned on to drive the HS_Drive node 120 high so as to turn on the high-side power switch S1. Thus, PMOS transistors M11 and M12 control the rise time of the switching output voltage $V_{SW}$ at the switch node. According to embodiments of the present invention, a rise time control circuit is incorporated in the high-side driver circuit 200 to reduce the slew-rate or reduce the rise time of the switching output voltage $V_{SW}$ without compromising transition efficiency. In the present embodiment, the rise time control circuit is integrated with the high-side driver circuit so that no components external to the switching regulator controller are needed to slow down the slew rate and reduce switch node ringing.

In embodiments of the present invention, the rise time control circuit includes a diode D11, a transistor M22 connected as an MOS capacitor, and a delay circuit 230. The diode D11 is referenced to the regulator power supply voltage $V_{dd}$. That is, the anode electrode of diode D11 is connected to the $V_{dd}$ voltage. The cathode electrode of diode D11 is connected to the gate electrode of transistor M22 which serves as one plate of the MOS capacitor. Transistor M22 has its source and drain terminals electrically connected together to form the other plate of the MOS capacitor where the source/drain terminal of transistor M22 is connected to the switching output voltage $V_{SW}$. The gate oxide serves as the dielectric of the MOS capacitor. As thus configured, the capacitor formed by transistor M22 is charged by the regulator power supply voltage $V_{dd}$ and a gate capacitor voltage $V_{GC}$ develops at the gate electrode of the transistor M22. In high-side driver circuit 200, the gate capacitor voltage $V_{GC}$ is coupled to the source terminal of PMOS transistor M11 and thus the MOS capacitor M22 functions to supply charge to transistor M11 when transistor M11 is turned on.

In high-side driver circuit 200, PMOS transistors M11 and M12 are both used to pull the gate electrode of the high-side power switch S1 high to turn on the high-side power switch S1. PMOS transistor M12 is connected in a pseudo-parallel manner with PMOS transistor M11. PMOS transistor M12 has its source terminal connected to the high supply voltage $V_{HV}$ (node 102) and the drain terminal connected to the HSD_drive node 120. The delay circuit 230 is incorporated between the gate electrode of transistor M11 and the gate electrode of transistor M12 so that transistor M12 receives the same gate control signal as transistor M11 but with a predetermined delay. In one embodiment, the delay circuit 230 is implemented using a string of two or more inverters.

The rise time control circuit operates as follows in the high-side driver circuit 200 to slow down the slew rate of the switching output voltage $V_{SW}$ and reduce ringing. When the Set_HS_Drive signal (node 106) is not asserted (logical low), the gate control signal generated by buffer 118 and applied to transistor M11 and transistor M12 (with delay) is at a logical high and thus transistors M11 and M12 are turned off. Meanwhile, the gate control signal generated by inverter 112 and applied to transistor M13 is at a logical high to turn on transistor M13, pulling the HS_Drive signal to the switching output voltage $V_{SW}$ (node 104) which is the logical low value. When transistors M11 is turned off, the MOS capacitor formed by transistor M22 is charged by the regulator supply voltage $V_{dd}$ through the diode D11. Thus, the MOS capacitor is precharged to a voltage value of $V_{dd}-V_{D11}$, where $V_{D11}$ is the forward voltage drop of diode D11.

Then, when the Set_HS_Drive signal (node 106) is asserted (logical high), the gate control signal generated by inverter 112 and applied to transistor M13 is at a logical low to turn off transistor M13. Meanwhile, the gate control signal generated by buffer 118 and applied to transistor M11 is at a logical low and transistor M11 is turned on. Transistor M12, receiving a delayed gate control signal, will not turn on until after the gate control signal propagated through the delay provided by delay circuit 230. Transistors M11 and M12 work in conjunction to pull the pulling the HS_Drive signal to the switching output voltage $V_{SW}$ (node 104) which is the logical low value.

When transistor M11 is turned on, the charge stored on the MOS capacitor of transistor M22 is passed to the HS_Drive node 120 and distributed to the gate electrode of the power switch S1 to turn on the power switch. More specifically, the MOS capacitor (transistor M22) provides a precise amount of charge to the gate electrode of power switch S1 so that power switch S1 is being turned on in a controlled manner to slow down the rise time of the switch node SW.

The amount of charge provided by transistor M22 to the gate electrode of the high-side power switch S1 is based on the size ratio of transistor M22 to the high-side power switch S1. In embodiments of the present invention, transistor M22 is formed as a ratioed device of the high-side power switch S1. That is, transistor M22 has an identical device structure as the high-side power switch S1 but has a size that is a portion of the power switch S1. In some embodiments, transistor M22 is about 33% to 50% of the size of power switch S1. Accordingly, transistor M22 will track any capacitance variation in the high-side power switch S1 so that the desired amount of charge is provided to the high-side power switch across process variations. In other embodiments, other types of capacitor device may be used to store the precharge voltage of the rise time control circuit.

Through the action of transistor M11, the high-side power switch S1 is turned on and the switching output voltage $V_{SW}$ is being pull up toward the input supply voltage $V_{IN}$. At some point before the charge on the MOS capacitor is fully dissipated, the delay provided by delay circuit 230 expires and transistor M12 is turned on to drive the final voltage excursion of the HS_Drive node 120 to the high supply voltage $V_{HV}$. The gate electrode of the high-side power switch S1 is thus driven to the high supply voltage $V_{HV}$ to allow the high-side power switch S1 to be fully turned on to drive the switching output voltage $V_{SW}$ to the input supply voltage $V_{IN}$.

Figure 4:
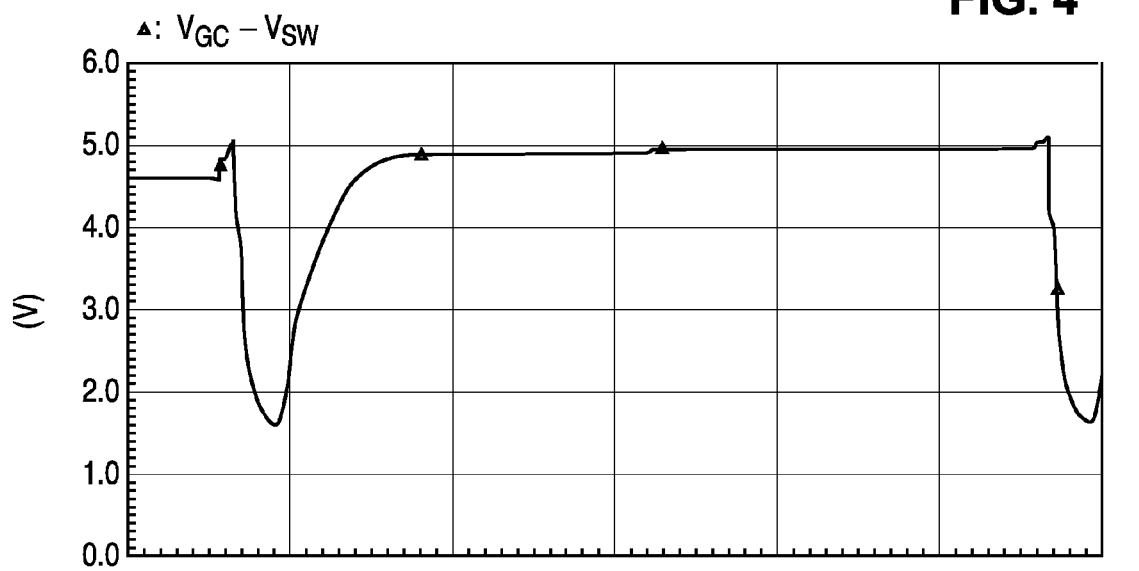
FIG. 4 illustrates the voltage waveform of the voltage across the MOS capacitor of transistor M22 when the high-side driver circuit is activated according to one embodiment of the present invention.

FIG. 4 illustrates the voltage waveform of the voltage across the MOS capacitor of transistor M22 when the high-side driver circuit is activated according to one embodiment of the present invention. Referring to FIG. 4, the MOS capacitor of transistor M11 is precharged to 4.5V being the $V_{dd}$ voltage (5V) minute the forward voltage drop of diode D11 (about 0.5V). Then, when the Set_HS_Drive signal is asserted and transistor M11 is turned on, the pre-charged MOS capacitor supplies the charge to the gate electrode of the high-side power switch through transistor M11. The voltage across the MOS capacitor drops to less than 2 volts as the charge is provided to the high-side power switch S1. After the delay provided by delay circuit 230, transistor M12 is turned on the provides charge to the high-side power switch S1 so that the MOS capacitor of transistor M22 can be recharged back up to the precharge voltage of about 4.5V.

Figure 5:
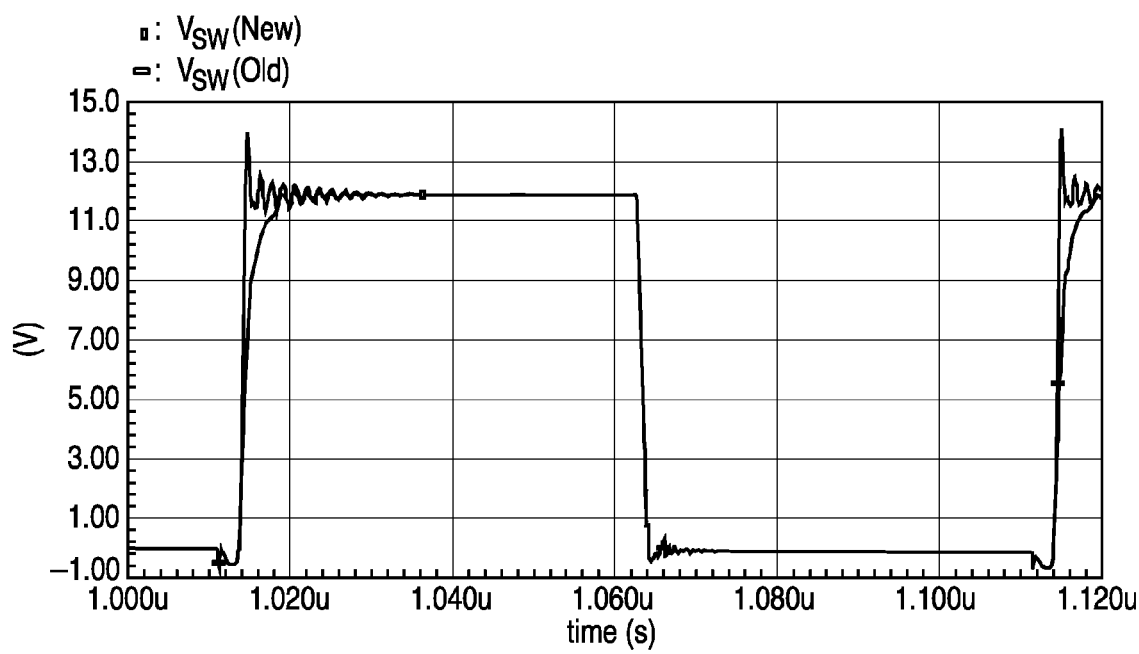
FIG. 5 illustrates the switching output voltage waveforms for a conventional high-side driver circuit and for the high-side driver circuit of FIG. 3 according to one embodiment of the present invention.
Figure 6:
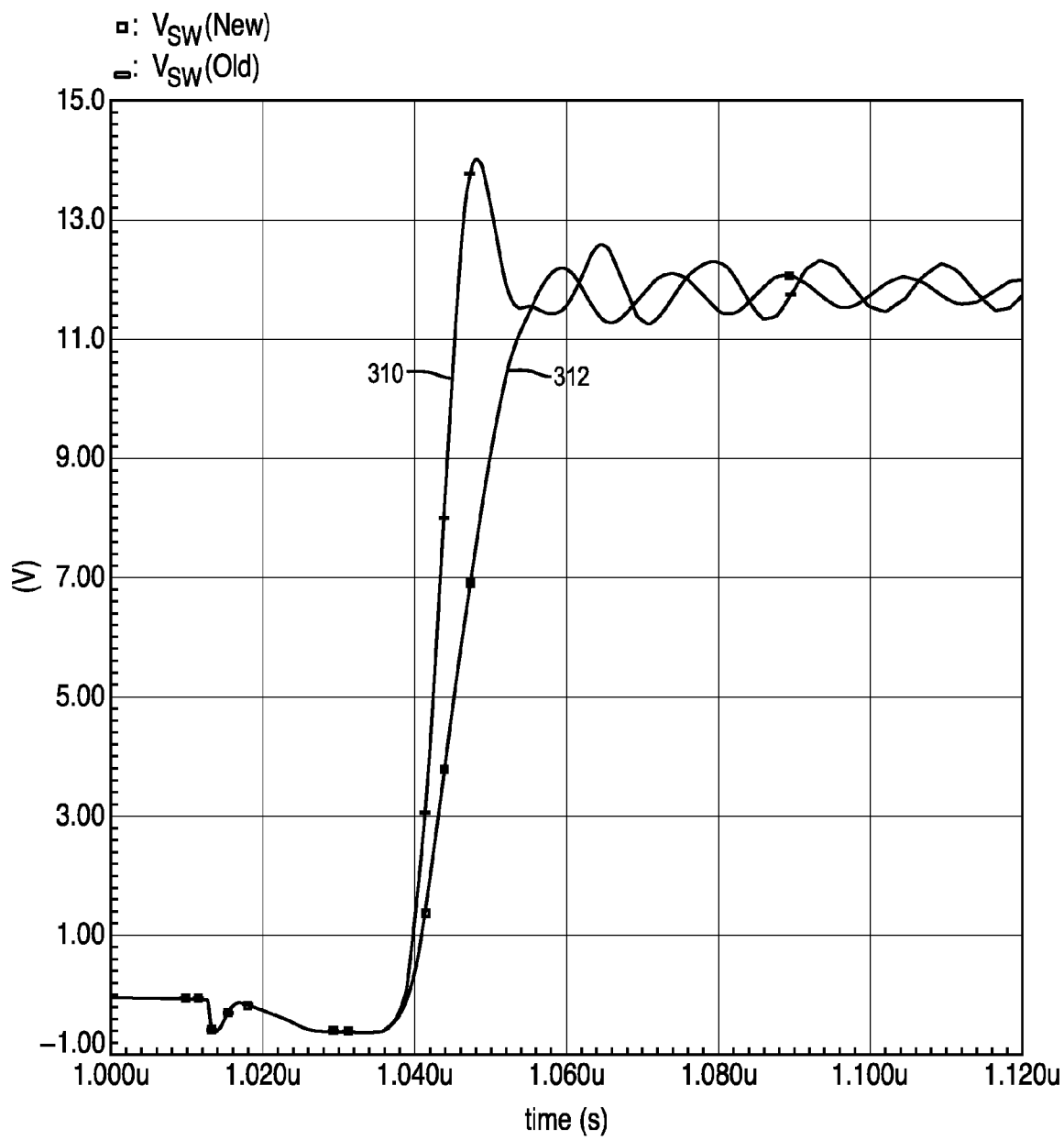
FIG. 6 is an expanded view of the switching output voltage waveforms of FIG. 5.

FIG. 5 illustrates the switching output voltage waveforms for a conventional high-side driver circuit and for the high-side driver circuit of FIG. 3 incorporating a rise time control circuit according to one embodiment of the present invention. FIG. 6 is an expanded view of the switching output voltage waveforms of FIG. 5. Referring to FIGS. 5 and 6, waveform 310 represents the switching output voltage $V_{SW}$ for a conventional high-side driver circuit and illustrates the amount of undesired ringing on the switch node when the switching output voltage is driven high to the input supply voltage (12V).

On the other hand, waveform 312 represents the switching output voltage $V_{SW}$ for the high-side driver circuit of FIG. 3 incorporating a rise time control circuit. When the HS_Drive signal is asserted, the switch node SW is supplied only by the charge stored on the MOS capacitor M22. The switching output voltage $V_{SW}$ rises quickly initially and then the slew rate slows down. The slowing of the rise time is because as the switch node rises, more charge is required to meet the drain-gate charge requirement and the MOS capacitor M22 provides only a precise amount of charge. At about the time the rise time slew rate slows down, the delay circuit 230 times out and transistor M12 is turned on to supply charge to the high-side power switch S1 from the high supply voltage rail $V_{HV}$ and to allow the charge across the MOS capacitor to be reconstituted as shown in FIG. 4.

Since the switching output voltage $V_{SW}$ has risen to near its full value of current ahead of the delay of delay circuit 230, the rate of change of the current flow (di/dt) after transistor M12 is turned on is close to zero and the continuing rise of the switch node to the input supply voltage $V_{IN}$ is realized with no overshoot, as shown by waveform 312 in FIGS. 5 and 6. In one embodiment, the switching output voltage $V_{SW}$ rises to nearly the input supply voltage $V_{IN}$ in less than 15 ns with no over-voltage ringing observed.

In embodiments of the present invention, the delay circuit 230 (FIG. 3) provides sufficient delay so that the switching output voltage $V_{SW}$ rises to about 80 to 90% of the input supply voltage $V_{IN}$ before the transistor M12 is turned on to supply the final charge to the high-side power switch S1. The rise time control circuit in high-side driver circuit 200 enables the switching output voltage to achieve a fast rise time, on the order of or better than the rise time achieved through the use of snubber circuits, and without desired ringing.

In the above-described embodiment, the high-side driver circuit is configured to drive a power switch S1 being an NMOS transistor. In other embodiments, the high-side driver circuit with the rise time control circuit can be configured to drive a PMOS power switch with appropriate change in voltage polarities.

The above detailed descriptions are provided to illustrate specific embodiments of the present invention and are not intended to be limiting. Numerous modifications and variations within the scope of the present invention are possible. The present invention is defined by the appended claims.

We claim:

1. A driver circuit for controlling a high-side power switch of a switching regulator, the high-side power switch being configured to drive a switching output voltage to an input supply voltage when the high-side power switch is turned on, the driver circuit comprising:
  a logic circuit configured to receive a first signal having a first state to turn on the high-side power switch and a second state to turn off the high-side power switch, the logic circuit being configured to generate a first gate control signal;
  a diode having an anode coupled to a first power supply voltage and a cathode;
  a capacitor having a first electrode coupled to the cathode of the diode and a second electrode coupled to the switching output voltage;
  a first output drive transistor having a gate terminal coupled to receive the first gate control signal, a source terminal coupled to the first electrode of the capacitor, and a drain terminal coupled to an output node of the driver circuit, the output node being coupled to drive the gate terminal of the high-side power switch;
  a delay circuit configured to receive the gate control signal and to generate a delayed gate control signal being the gate control signal with a predetermined delay;
  a second output drive transistor having a gate terminal coupled to receive the delayed gate control signal, a source terminal connected to a high supply voltage, and a drain terminal connected to the output node of the driver circuit, the high supply voltage being the sum of the input supply voltage and the first power supply voltage,
  wherein the capacitor is charged to about the first power supply voltage when the first signal has the second state; and when the first signal has the first state, the first output drive transistor is turned on to distribute the charge stored on the capacitor to the output node for driving the gate terminal of the high-side power switch, and after the predetermined delay, the second output drive transistor is turned on to drive the output node to the high supply voltage.

2. The driver circuit of claim 1, wherein the capacitor comprises a MOS capacitor.

3. The driver circuit of claim 2, wherein the MOS capacitor is formed using a transistor having the same device structure as the high-side power switch with a transistor size being a portion of the size of the high-side power switch.

4. The driver circuit of claim 3, wherein the MOS capacitor is formed using a transistor having a size being about 30% to 50% of the size of the high-side power switch.

5. The driver circuit of claim 1, wherein the first output drive transistor and the second output drive transistor comprise PMOS transistors.

6. The driver circuit of claim 1, wherein the delay circuit comprises one or more inverters.

7. The driver circuit of claim 1, wherein the delay circuit provides the predetermined delay to the gate control signal to turn on the second output drive transistor when the switching output voltage has reached about 80% of the input supply voltage.

8. A method for driving a high-side power switch of a switching regulator, the high-side power switch being configured to drive a switching output voltage to an input supply voltage when the high-side power switch is turned on, the method comprising:

charging a capacitor to a first power supply voltage when the high-side power switch is turned off;

asserting a first signal to turn on the high-side power switch;

generating a gate control signal to turn on a first output drive transistor;

distributing charge stored on the capacitor through the first output drive transistor to an output node, the output node being coupled to drive the gate terminal of the high-side power switch; and after a predetermined delay, turning on a second output drive transistor to drive the output node to a high supply voltage, the high supply voltage being the sum of the input supply voltage and the first power supply voltage.

9. The method of claim 8, wherein the capacitor comprises a MOS capacitor.

10. The method of claim 9, wherein the MOS capacitor is formed using a transistor having the same device structure as the high-side power switch with a transistor size being a portion of the size of the high-side power switch.

11. The method of claim 10, wherein the MOS capacitor is formed using a transistor having a size being about 30% to 50% of the size of the high-side power switch.

12. The method of claim 8, wherein the first output drive transistor and the second output drive transistor comprise PMOS transistors.

13. The method of claim 8, wherein the predetermined delay comprises a delay time until the switching output voltage has reached about 80% of the input supply voltage.

* * * * *